United States Patent
Raymond

(10) Patent No.: US 11,700,682 B2
(45) Date of Patent: Jul. 11, 2023

(54) THERMOELECTRIC COOLING OF CONSUMABLES IN A PLASMA TORCH

(71) Applicant: The ESAB Group Inc., Florence, SC (US)

(72) Inventor: Andrew Raymond, Lebanon, NH (US)

(73) Assignee: THE ESAB GROUP, INC., North Bethesda, MD (US)

( * ) Notice: Subject to any disclaimer, the term of this patent is extended or adjusted under 35 U.S.C. 154(b) by 873 days.

(21) Appl. No.: 16/512,656

(22) Filed: Jul. 16, 2019

(65) Prior Publication Data

US 2021/0022235 A1  Jan. 21, 2021

(51) Int. Cl.
- H05H 1/28 (2006.01)
- H10N 10/13 (2023.01)
- F25B 21/02 (2006.01)

(52) U.S. Cl.
CPC ............... *H05H 1/28* (2013.01); *F25B 21/02* (2013.01); *H10N 10/13* (2023.02); *F25B 2321/025* (2013.01)

(58) Field of Classification Search
CPC .............. H01L 35/00–34; H01L 27/16; H05H 1/26–44
USPC ..... 136/200–242; 219/76.16, 121.48–121.53
See application file for complete search history.

(56) References Cited

U.S. PATENT DOCUMENTS

| | | | |
|---|---|---|---|
| 4,710,607 A * | 12/1987 | Wilhelmi | H05H 1/28 219/121.36 |
| 5,367,163 A | 11/1994 | Otsuka et al. | |
| 5,796,067 A * | 8/1998 | Enyedy | B23K 10/00 219/121.52 |
| 6,509,520 B1 | 1/2003 | Kyle et al. | |
| 6,891,127 B2 | 5/2005 | Baum et al. | |
| 8,853,593 B2 | 10/2014 | Hampton | |
| 8,981,253 B2 | 3/2015 | Shipulski et al. | |
| 10,124,445 B2 | 11/2018 | Gomez et al. | |
| 2004/0094192 A1* | 5/2004 | Luo | H01L 35/30 136/203 |
| 2005/0279105 A1* | 12/2005 | Pastorino | H01L 35/30 136/204 |
| 2006/0137361 A1* | 6/2006 | Ghoshal | F25B 21/02 62/3.2 |
| 2010/0199687 A1* | 8/2010 | Woods | H01L 35/30 165/181 |

(Continued)

FOREIGN PATENT DOCUMENTS

| | | |
|---|---|---|
| EP | 2275221 A2 | 1/2011 |
| NL | 7713149 A | 5/1979 |
| WO | WO2018071010 * | 4/2018 |

*Primary Examiner* — Bach T Dinh
(74) *Attorney, Agent, or Firm* — Edell, Shapiro & Finnan, LLC

(57) ABSTRACT

A plasma torch that includes an electrode having an exterior surface and a tip having an interior surface spaced apart from and facing the exterior surface of the electrode. A process gas flow channel located being located between the exterior surface of the electrode and the interior surface of the tip. A thermoelectric cooler having a cold plate and a hot plate is disposed between the exterior surface of the electrode and the interior surface of the tip with the cold plate being thermally connected to the exterior surface of the electrode. According to some implementations, electrical power is deliverable to the thermoelectric cooler only up electrical power being supplied to the electrode.

20 Claims, 19 Drawing Sheets

(56) References Cited

U.S. PATENT DOCUMENTS

| | | |
|---|---|---|
| 2011/0088739 A1 | 4/2011 | Zinn et al. |
| 2012/0291425 A1* | 11/2012 | Mitchell ................. H01L 35/32 |
| | | 136/224 |
| 2015/0123540 A1* | 5/2015 | Holbeche ............. H05H 1/2406 |
| | | 315/111.21 |
| 2016/0181499 A1 | 6/2016 | Denis et al. |
| 2017/0182582 A1 | 6/2017 | Daniels et al. |
| 2020/0105993 A1* | 4/2020 | Kim ........................ H01L 35/30 |

* cited by examiner

THERMOELECTRIC COOLING OF CONSUMABLES IN A PLASMA TORCH

TECHNICAL FIELD

The present disclosure relates to plasma cutting systems, and more particularly to cooling consumable components in a plasma torch.

BACKGROUND

The tip and electrode of a plasma torch are consumable components that are subjected to very high temperatures in the range of between about 900 to 1300° C. when an arc is produced in the plasma torch. The high temperature environment at which the consumables operate accelerates the deterioration of the metals of which the consumables are made, requiring a periodic replacement of the consumables. In addition, it is known that the electrical conductivity of a metal decreases with an increase in its temperature, thus affecting the electrical efficiency of the plasma cutting system. For these reasons, some traditional plasma torches employ liquid cooling to regulate the electrode temperature and, consequently, the temperature of its surrounding components. These liquid cooling systems are effective, but are relatively complex in design and costly. The liquids used in such systems can also be corrosive if their chemistry is not properly regulated. The use of non-corrosive or minimally corrosive liquids can also be costly.

Accordingly, a need remains in the art to provide more simplistic and cost effective cooling methods for cooling plasma torch consumables and/or additional cooling methods that can be used independently or in conjunction with traditional liquid cooling systems to increase the operating life of the consumables.

SUMMARY

The present disclosure is directed towards plasma torch assemblies that include the use of one or more thermoelectric coolers to remove heat away from a plasma torch electrode. According to some implementations, the electrode and one or more thermoelectric coolers are assembled to comprise a single part that is configured for placement inside the tip of the plasma torch. According to some implementations, the electrode also includes an internal cavity through which a liquid coolant is configured to pass.

Thermoelectric coolers operate according to the Peltier effect. The effect creates a temperature difference by transferring heat between two electrical junctions. This is accomplished by applying a voltage across joined dissimilar conductors to create an electric current that flows through the dissimilar conductors. When current flows through the junctions of the dissimilar conductors, heat is removed at one junction and cooling occurs. Heat is deposited at the other junction. The heat is carried along the conductors by electron transport as the electrons move from a high-energy state to a low-energy state.

According to some implementations, the dissimilar conductors of the one or more thermoelectric coolers comprise an array of alternating n-type and p-type semiconductors that have complementary Peltier coefficients. The array of elements is soldered between two ceramic plates (a cold plate and a hot plate), electrically in series and thermally in parallel. Examples of semiconductors that can be made both n-type and p-type are solid solutions of bismuth telluride, antimony telluride, and bismuth selenide. These and other currently developed or future developed dissimilar conductor pairs may also be used.

According to some implementations, the electrode is electrically coupled to one of thermoelectric cooler conductors such that when power is supplied to the electrode, power is also supplied to the thermoelectric cooler. In this manner, thermoelectric cooling of the electrode only occurs when the electrode is energized. According to some implementations, the power is delivered to the thermoelectric cooler through a voltage reduction circuit disposed electrically between the electrode and thermoelectric cooler. According to some implementations, the conductor of the thermoelectric cooler is electrically coupled directly to the electrode.

According to other implementations, electrical power at a first voltage is delivered to the electrode via a first electrical circuit and electrical power at a second voltage, less than the first voltage, is delivered to the thermoelectric cooler via a second electrical circuit. According to some implementations, the second circuit includes a relay or switch that transitions from an open position to a closed position to permit the delivery of electrical power to the thermoelectric cooler only upon there being electrical power being delivered to the electrode.

According to some implementations the thermoelectric cooler is disposed between the exterior surface of the electrode and an interior surface of the plasma torch tip with there being a process gas flow channel located between the hot plate and the interior surface of the tip. According to such implementations, heat is carried away from the hot plate by convection heat transfer when the process gas passes through the process gas flow channel.

According to some implementations, an exterior surface of the hot plate of the thermoelectric cooler is attached to the interior surface of the tip and process gas flow is directed through an interior space of the thermoelectric cooler toward a distal-most opening in the tip. According to some implementations, the interior space of the thermoelectric cooler is configured to cause the process gas to swirl inside the tip as the process gas exits the thermoelectric cooler.

According to some implementations, when multiple thermoelectric coolers are used, they may be arranged side by side with the hot plate of one being thermally coupled to the cold plate of another.

According to some implementations, a single thermoelectric cooler is used that at least partially or fully circumscribes the exterior surface of the electrode. According to some implementations, the thermoelectric cooler forms a tube around the electrode. According to other implementations, a first thermoelectric cooler is attached to a first part of the electrode and a second thermoelectric cooler is attached to a second part of the electrode.

According to some implementations, a thermal insulating element is located between the exterior surface of the electrode and the cold plate in order to reduce heat flow between them for the purpose of suppressing the temperature of the cold plate. In some instances, this can increase the heat pump efficiency of the thermoelectric cooler by minimizing the temperature drop between the cold and hot plates.

According to some implementations, in lieu of or in conjunction with the use of one or more thermoelectric coolers to cool the electrode and its surrounding components, cooling is achieved by cooling the process gas before its delivery into the process gas flow channel inside the plasma torch. According to some implementations, the process gas is cooled inside a duct located inside a power supply through which process gas is delivered to the torch and/or inside a cable hose that connects the plasma torch to the power supply and/or inside the plasma torch handle. The duct is made of a high thermally conductive material and includes an internal through passage through which the process gas flows. To effectuate a cooling of the process gas as it passes through the internal through passage the cold plates of one or more thermoelectric coolers are attached to one or more exterior surfaces of the duct. Heat removal from the one or more hot plates of the one or more thermoelectric coolers may be achieved via natural or forced convection to the ambient environment and/or by conduction to a heat sink.

These and other advantages and features will become evident in view of the drawings and detailed description.

DETAILED DESCRIPTION

Figure 1A:
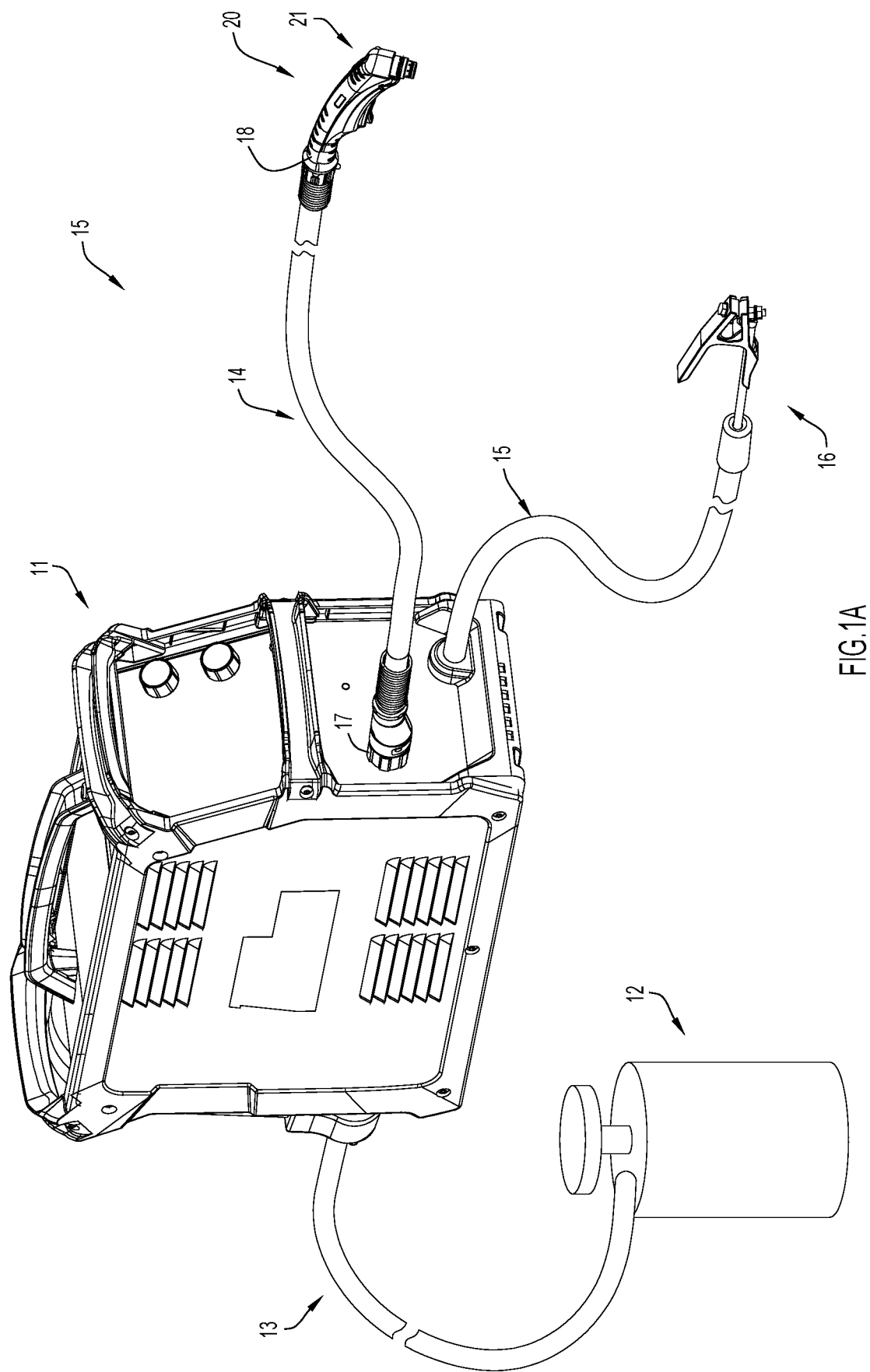
FIG. 1A is a perspective view of a cutting system according to one implementation.

Various implementations of cooling an electrode of a plasma torch are disclosed herein. FIG. 1 illustrates an example cutting system 10 in which the techniques presented herein may be carried out. The depicted cutting system 10 includes a power supply 11 that supplies power to a torch assembly 20. The power supply 11 also controls the flow of a process gas from a process gas supply 12 to the torch assembly 20 (however, in other implementations, the power supply 11 might supply the process gas itself). The process gas supply 12 is connected to the power supply via cable hose 13 and the power supply 11 is connected to the torch 21 included in the torch assembly 20 via cable hose 14. The cutting system 10 also includes a working lead 15 with a grounding clamp 16 disposed at an end thereof.

Cable hose 13, cable hose 14, and/or working lead 15 may each include various conductors so that they may transmit data, electricity, signals, etc. between components of the cutting system 10 (e.g., between the power supply 11 and the torch 21 of the torch assembly 20) and, as is illustrated, cable hose 13, cable hose 14, and/or working lead 15 may each be any length. In order to connect the aforementioned components of the cutting system 10, the opposing ends of cable hose 13, cable hose 14, and/or working lead 15 may each be coupled to the gas supply 12, power supply 11, torch 21, or clamp 16 in any manner now known or developed hereafter (e.g., a releasable connection). The cable hose 14 may include a first connector 17 that releasably couples a first end of the cable hose 14 to a port of the power supply 11 and may also include a second connector 18 that releasably couples a second end of the cable hose 14 to the torch 21. Thus, the torch 21 may be releasably coupled to the power supply 11 via a releasable connection formed between the cable hose 14 and the power supply 11 and/or via a releasable connection formed between the cable hose 14 and the torch 21.

Figure 1B:
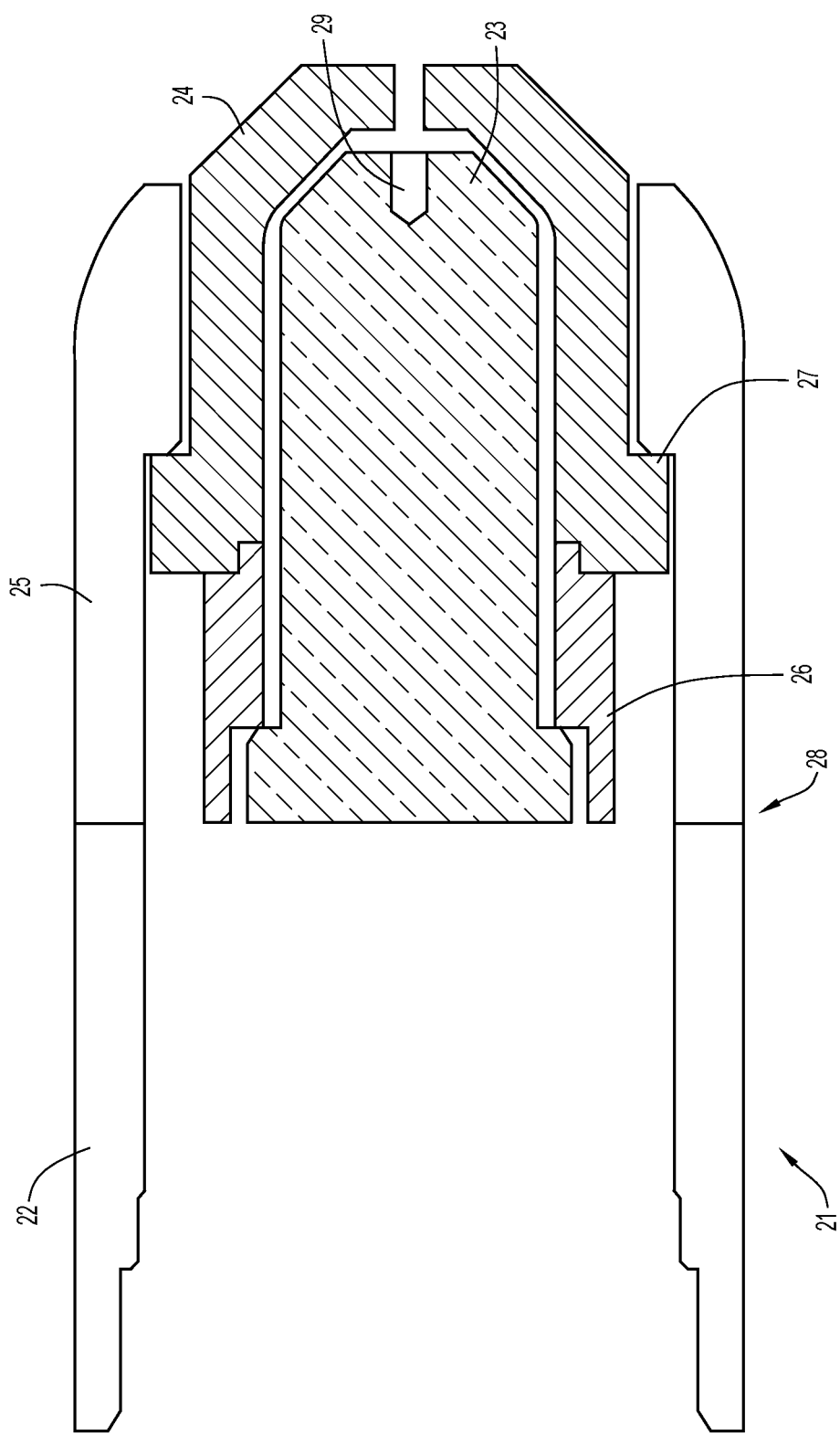
FIG. 1B is a cross-section side view of an end section of a plasma torch according to one implementation.

FIG. 1B illustrates a portion of the torch 21 according to one implementation. For simplicity, FIG. 1B illustrates a distal end portion of the plasma torch without various components or parts, such as power or gas transfer components, that are typically included in a plasma cutting torch. Instead, FIG. 1B only illustrates select components or parts that allow for a clear and concise illustration of the techniques presented herein. In the depicted implementation, the torch body 22 includes a number of consumable parts, such as, for example, an electrode 23, a torch tip 24, a shield cup 25 and gas distributor 26. Located in a distal end portion of the electrode 23 is an emitter 29. The gas distributor 26 and the electrode 23 can be installed into the torch body 22 and the torch tip 24 can be installed there over. Alternatively, the gas distributor 26, the electrode 23, and the tip 24 can be installed onto the torch body as a single component (e.g., these components may be coupled to each other to form a cartridge and installed on/in the torch body 22 as a cartridge).

Once the electrode 23 and the tip 24 are installed onto/into the torch body 22, the shield cup 25 is installed around an installation flange 27 of the torch tip 24 in order to secure the torch tip 24 and electrode 23 in place at (and in axial alignment with) an operating end 28 of the torch body 102. Additionally or alternatively, the torch tip 24 and/or electrode 23 can be secured or affixed to the torch body 22 in any desirable manner, such as by mating threaded sections included on the torch body 22 with corresponding threads included on the components. For example, in some implementations, the electrode 23, the torch tip 24, the shield cup 25, the gas distributor 26, as well as any other components (e.g., a lock ring, spacer, secondary cap, etc.) may be assembled together in a cartridge that may can be selectively coupled to the torch body 22. For example, the various components may be coupled to a cartridge body or coupled to each other to form a cartridge.

In use, the plasma torch 20 is configured to emit a plasma arc between the electrode 23 and a workpiece to which the grounding clamp 16 is attached. As shown in FIG. 1B, the torch tip 24 is spaced a distance away from the electrode 23 with there being a process gas flow channel 30 disposed between them. During initiation, power is first supplied to the torch tip 24 (anode) to generate an arc between the torch tip 24 and the electrode 23 (cathode) across the process gas flow channel 30. As process gas flows through channel 30 during arc initiation it is ionized to form an electrically conductive plasma that is then directed out the tip toward an electrically conductive workpiece (e.g. metal workpiece). Once this occurs, power (typically DC power) is supplied to the electrode 23 and an electrical circuit is established between the power source and a ground to which the workpiece is coupled via the grounding clamp 16. A plasma arc that closes the electrical circuit is thus established between the electrode 23 and the workpiece, the plasma arc being sufficient to cut through the workpiece by a localized melting of the material from which the workpiece is made. When power is supplied to the electrode 23, power to the torch tip 24 is terminated.

Figure 1C:
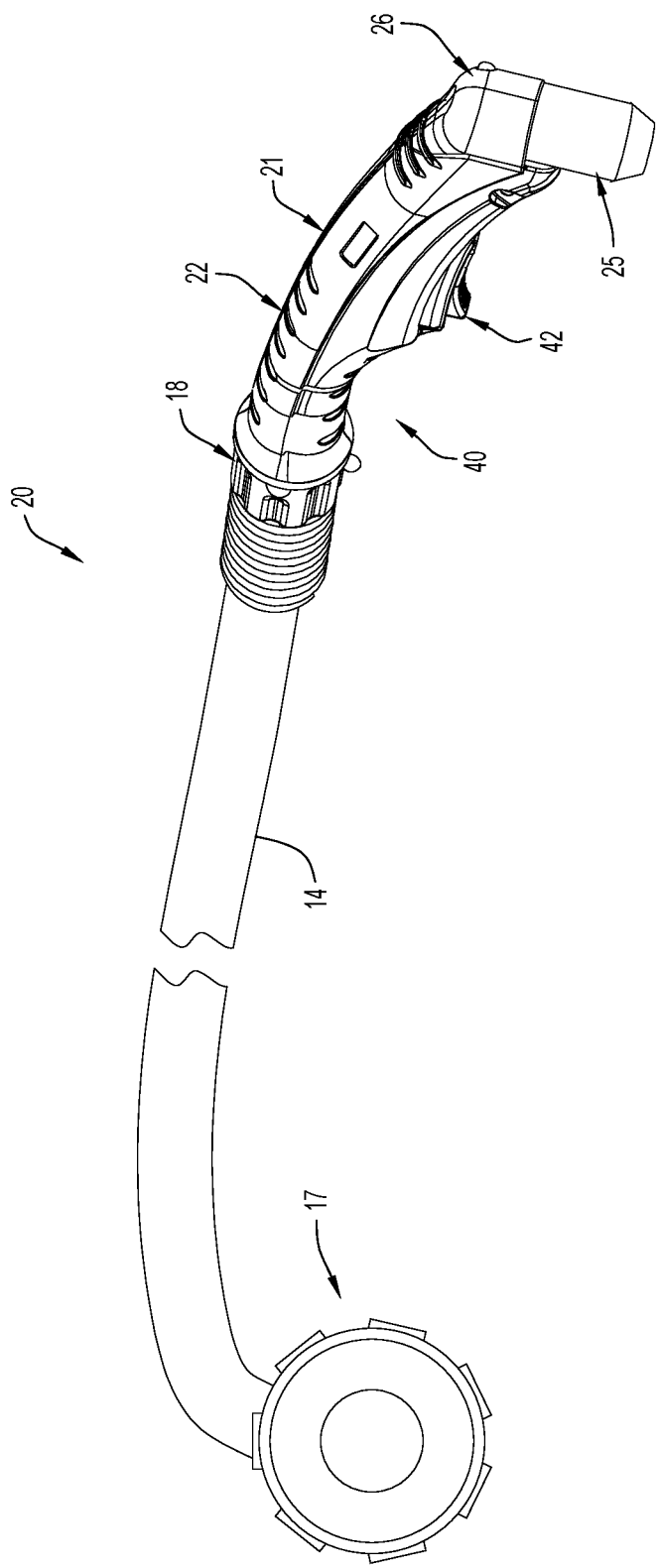
FIG. 1C is an enlarged view of the plasma torch assembly shown in FIG. 1A.

FIG. 1C depicts an enlarged perspective view on an exterior of the plasma torch 21 connected to the cable hose 14. The torch 21 includes a handle 40 that may comprise a portion of the torch body 22. The handle 40 includes a trigger 42 that is configured to transition between an "off" position when it is not being depressed by a user of the torch and an "on" position when it is being depressed by the user of the torch. The trigger 42 is typically biased to the "off" position. The trigger 42 is operable to cause an electrical switch located inside the handle 40 or in the power supply 11 to open and close when the trigger is respectively in the "off" and "on" position. The electrical switch is disposed between a power source located inside the power supply 11 and the electrode 23. Hence, when the trigger is in the "on" position the power source is electrically coupled to the electrode 23, and when the trigger is in the "off" position the power source is not electrically coupled to the electrode 23. According to some implementations, the trigger 42 is also operable to control the delivery of the process gas from the power supply 11 to the torch 21.

When power is being delivered to the electrode 23 during a plasma arc cutting operation, the temperature of the electrode can be in a range of 900° C. to 1300° C. Because of their close proximity to the electrode 23, the torch tip 24, shield cap 25 and gas distributor 26 are also subjected to high temperatures. As explained above, as a result of operating at high temperatures, the useful life of these consumable components is shortened. To address this issue, disclosed herein are heat extraction techniques for reducing the operating temperature of the electrode 23 during a plasma arc cutting operation.

Figure 2:
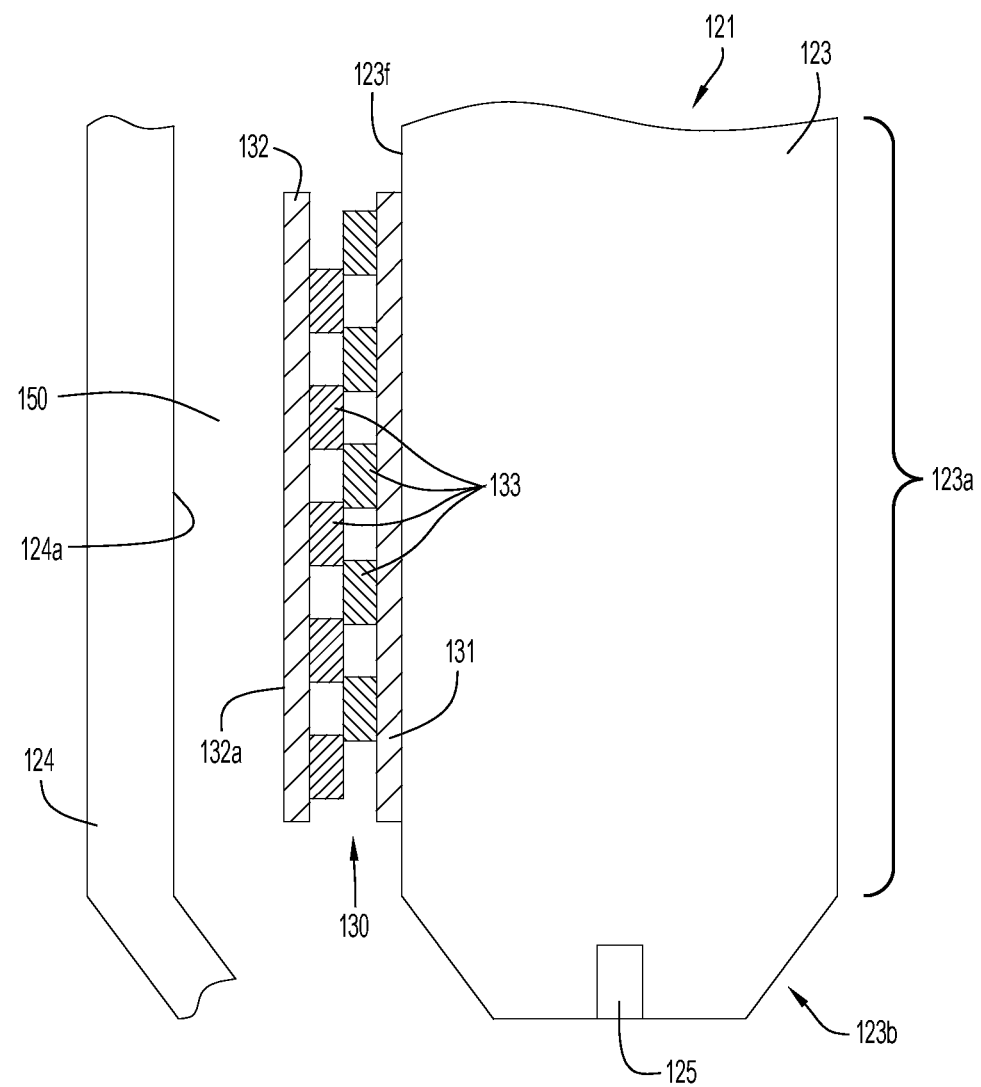
FIG. 2 is a partial cut-away side view of an electrode and tip of a plasma torch with a cold plate of a thermoelectric cooler being attached to an exterior surface of the electrode.

FIG. 2 is a partial cut-away side view of an electrode 123 (with an emitter 125) and tip 124 of a plasma torch 121 with a cold plate 131 of a thermoelectric cooler 130 being attached to an exterior surface 123$f$ of the electrode. An exterior surface 132$a$ of the hot plate 132 of the thermoelectric cooler 130 forms at least in part a radially inward wall of a process gas flow channel 150, and the interior surface 124$a$ of the torch tip 124 forms at least in part a radially outward wall of the process gas flow channel 150. Hence, when the plasma torch is operated with electrical power being supplied to the electrode 123 and process gas is passed through flow channel 150, heat is transferred away from the thermoelectric cooler hot plate 132 by the process gas via convection heat transfer. Although not shown in the figures, according to some implementations a heat sink with fins may be thermally coupled to the exterior surface 132$a$ of the hot plate 132 in order to increase the effective surface area through which heat is removed from the hot plate 132. Alternatively, grooves may be provided in the exterior surface 132$a$ of the hot plate 132 for the same purpose.

As explained above, thermoelectric coolers operate according to the Peltier effect. The effect creates a temperature difference by transferring heat between two electrical junctions. This is accomplished by applying a voltage across joined dissimilar conductors to create an electric current that flows through the dissimilar conductors. When the current flows through the junctions of the dissimilar conductors, heat is removed at one junction and cooling occurs. Heat is subsequently deposited at the other junction. The heat is carried along the conductors by electron transport as the electrons move from a high-energy state to a low-energy state.

Figure 4:
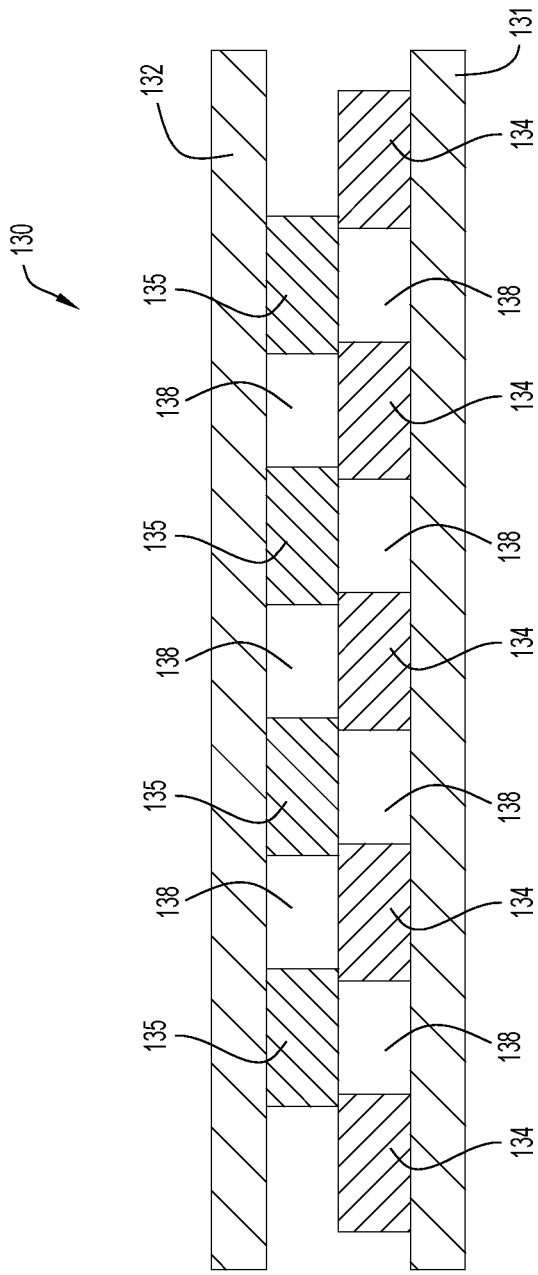
FIG. 4 is a side view of a thermoelectric cooler according to one implementation.

FIG. 4 is a side view of an example thermoelectric cooler 130 that includes an array 133 of alternating first and second conductors 134 and 135 with the first conductors 134 being made of a first metal and the second conductors 135 being made of a second metal different than the first metal. The first conductors 134 and second conductors 135 are arranged electrically in series such that a current runs serially through the conductors when a first end of the array is connected to a power source and a second end of the array is coupled to ground. As shown in FIG. 4, the first conductors 134 are thermally coupled to the cold plate 131 and the second conductors 135 are thermally coupled to the hot plate 132 so that the first and second conductors are arranged thermally in parallel to transport heat away from the cold plate 131 and into the hot plate 132 when current is passed through the array of conductors. Each of the cold and hot plates is made of a non-electrically conductive material, such as, for example, a ceramic material.

As an example, the first and second conductors 134 and 135 may respectively comprise alternating n-type and p-type semiconductors that have complementary Peltier coefficients. Examples of semiconductors that can be made both n-type and p-type are solid solutions of bismuth telluride, antimony telluride, and bismuth selenide. These and other currently developed or future developed dissimilar conductor pairs may also be used.

Figure 5:
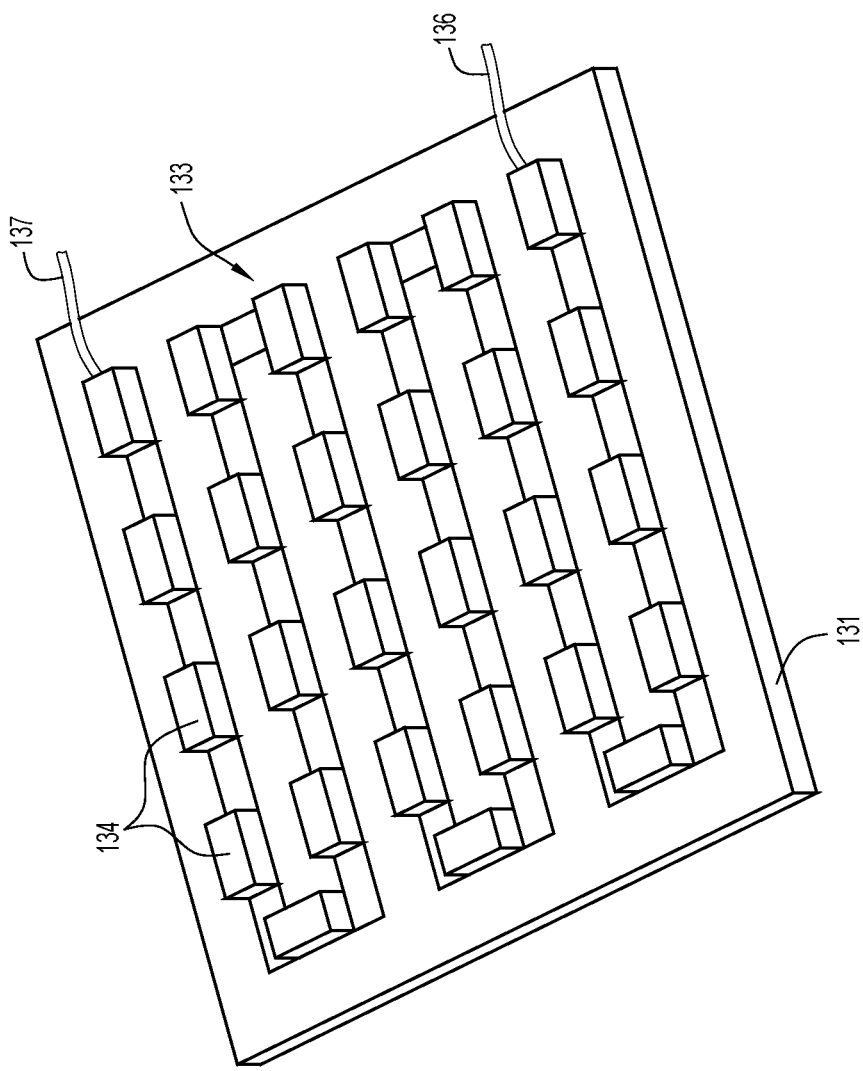
FIG. 5 is a perspective view of the thermoelectric cooler shown in FIG. 4 with the hot plate removed.

FIG. 5 is a perspective view of an implementation of the thermoelectric cooler 130 shown in FIG. 4 with the hot plate removed. Electrically coupled to a first end of the array 133 is a first electrical lead 136, and electrically coupled to a second end of the array 133 is a second electrical lead 137. According to one implementation, the first electrical lead 136 is capable of being coupled to the power source and the second electrical lead 137 is coupled to ground. Alternate methods for delivering electrical power to the thermoelectric cooler 130 are discussed in more detail below.

In FIGS. 4 and 5 the thermoelectric cooler 130 is shown having a rectangular shape with the array 133 of first and second conductors 134 and 135 being disposed between flat hot and cold plates 131 and 132. However, as discussed below, according to some implementations the thermoelectric cooler 130 may be tubular or semicircular in form.

Figure 3A:
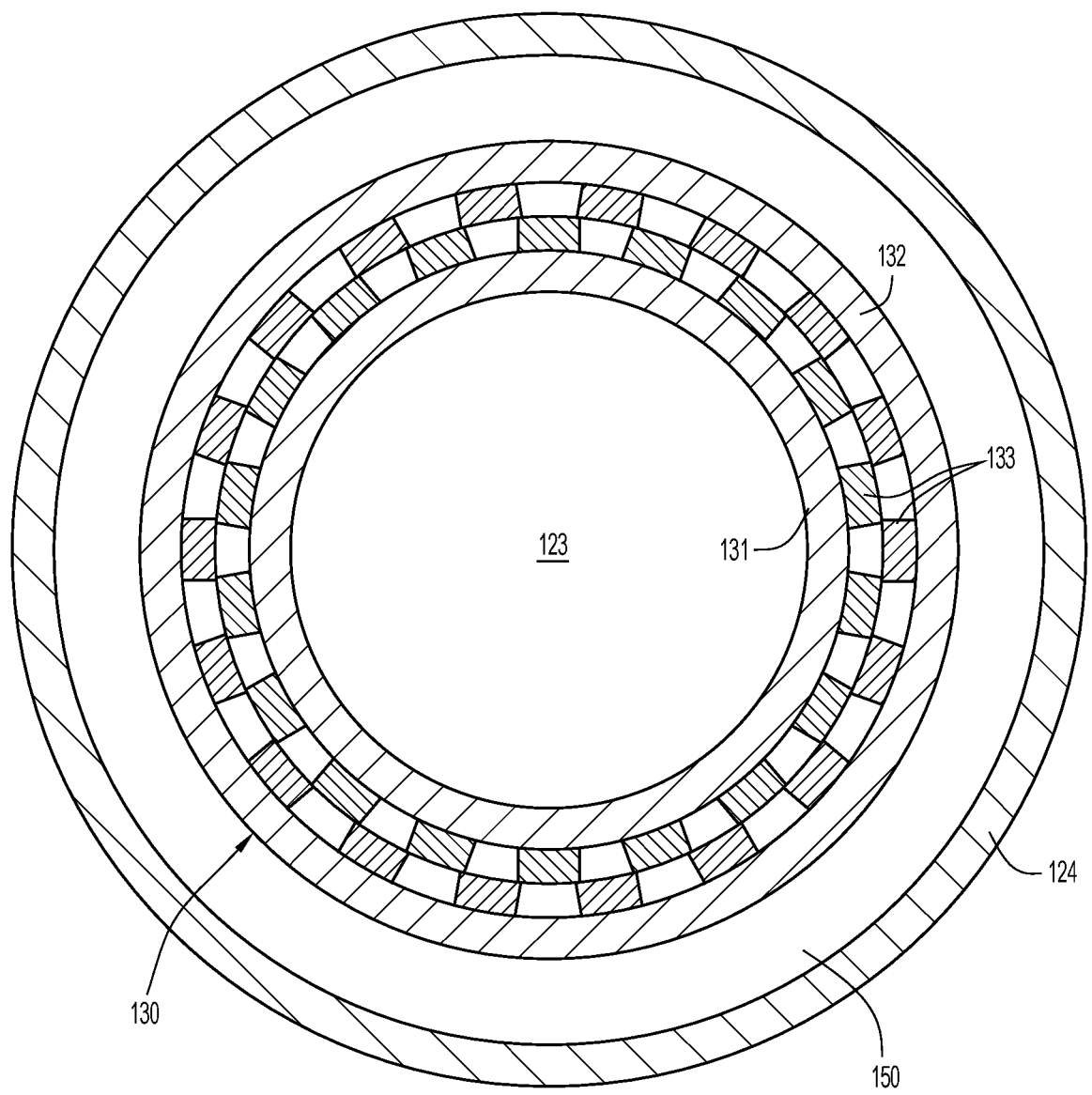
FIG. 3A is a cross-sectional top view of an electrode, tip and thermoelectric cooler of a plasma torch according to one implementation.
Figure 3B:
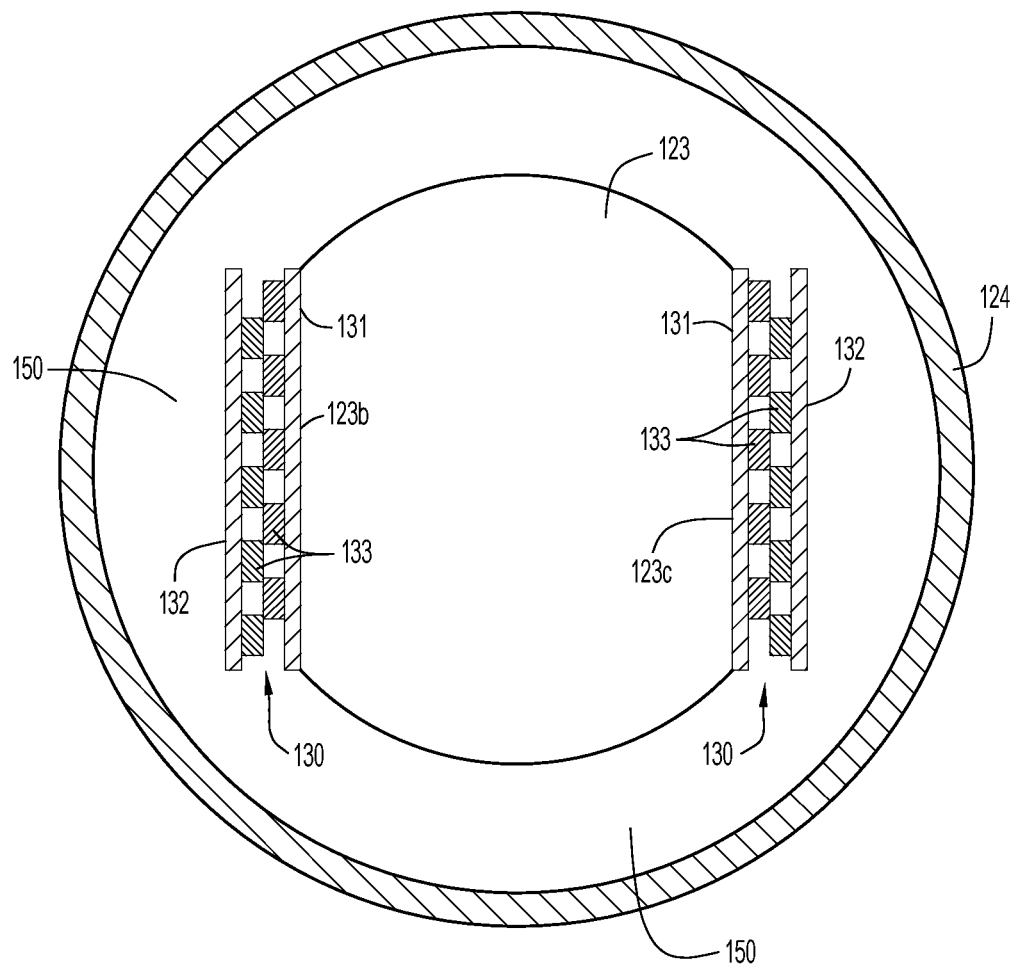
FIG. 3B is a cross-sectional top view of an electrode, tip and thermoelectric cooler of a plasma torch according to another implementation.
Figure 3C:
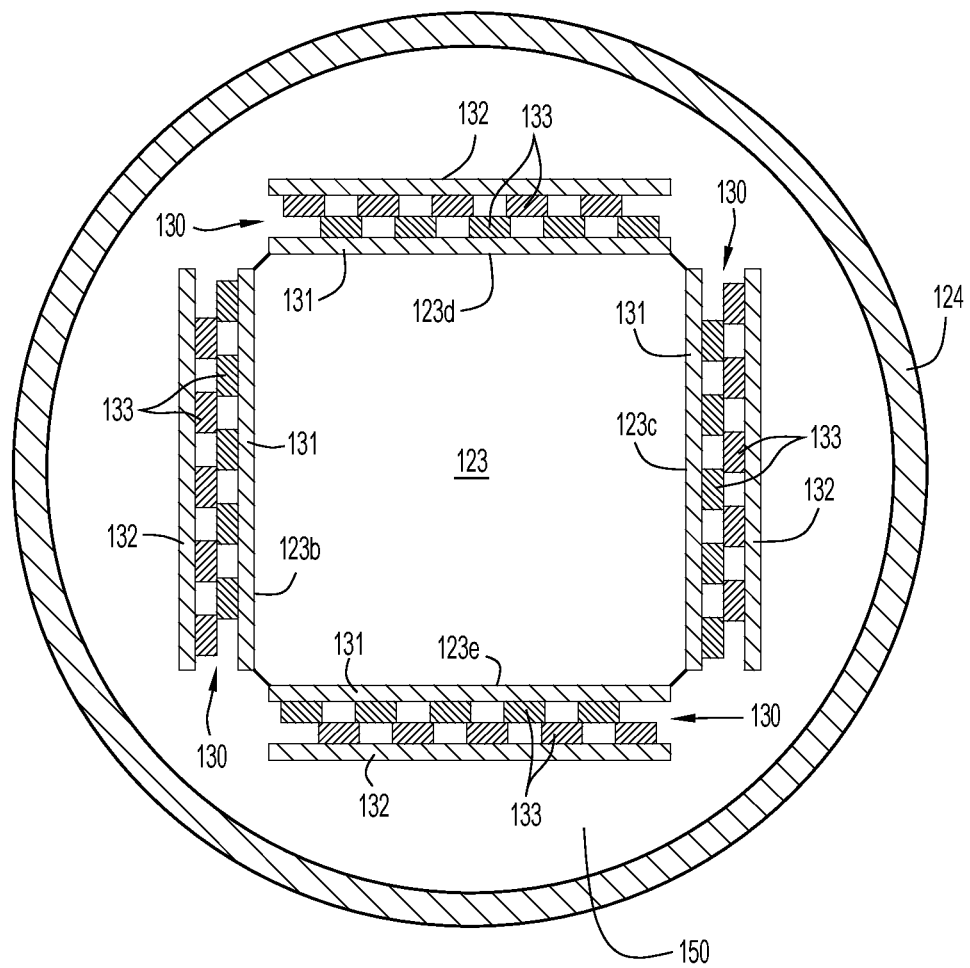
FIG. 3C is a cross-sectional top view of an electrode, tip and thermoelectric cooler of a plasma torch according to another implementation.

In the implementation of FIG. 2, the electrode 123 has a main body portion 123*a* and a tapered distal portion 123*b* extending distal to the main body portion. As will be discussed in more detail below, according to some implementations the exterior profile of the main body portion 123*a* of the electrode 123 is a circular profile as shown in FIG. 3A, while according to other implementations the exterior profile of the main body portion 123*a* is a semicircular profile with one or more flat sides as shown in FIG. 3B, while according to other implementations the exterior profile of the main body portion 123*a* is a rectangular profile (or any other polygonal profile) as shown in FIG. 3C. In each of the implementations of FIGS. 3A-C, the tapered distal portion 123*b* of the electrode 123 may comprise a truncated conical shape.

FIG. 3A is a top view of a plasma torch similar to that shown in FIG. 2, wherein each of the main body portion 123*a* of the electrode 123, tip 124 and thermoelectric cooler 130 have a cross-sectional circular profile. The cold plate 131 of the thermoelectric cooler 130 is in thermal contact with and circumscribes the outer peripheral surface 123*f* of the electrode 123. The hot plate 132 of the thermoelectric cooler surrounds the cold plate 131, and there exists between the cold and hot plates the array 133 of first and second conductors 134 and 135. In the example of FIG. 3A a single thermoelectric cooler is shown in tubular form. However, according to other implementations multiple semicircular thermoelectric coolers may be positioned about the electrode 123 in lieu of a single thermoelectric cooler.

FIG. 3B is a top view of a plasma torch similar to that shown in FIG. 2, wherein the main body portion 123*a* of the electrode 123 has a semicircular shape and two flat sides 123*b* and 123*c* that are each fitted with a thermoelectric cooler 130. An advantage of providing the electrode 123 with one or more exterior flat sides is that it allows the use of traditional thermoelectric coolers having flat cold and hot plates that are more readily available and less costly than the tubular and semicircular thermoelectric coolers disclosed above. The plasma torch tip 124 circumscribes the electrode 123 fitted with the two thermoelectric coolers 130 to produce the process gas flow channel 150.

FIG. 3C is a top view of a plasma torch similar to that shown in FIG. 2, wherein the main body portion 123*a* of the electrode 123 has a rectangular shape and four flat sides 123*b*, 123*c*, 123*d* and 123*e* that are each fitted with a thermoelectric cooler 130. Like the implementation of FIG. 3B, an advantage of providing the electrode 123 with flat exterior surfaces is that it allows the use of traditional flat thermoelectric coolers. Like above, the plasma torch tip 124 circumscribes the electrode 123 fitted with the four thermoelectric coolers 130 to produce the process gas flow channel 150.

Figure 6:
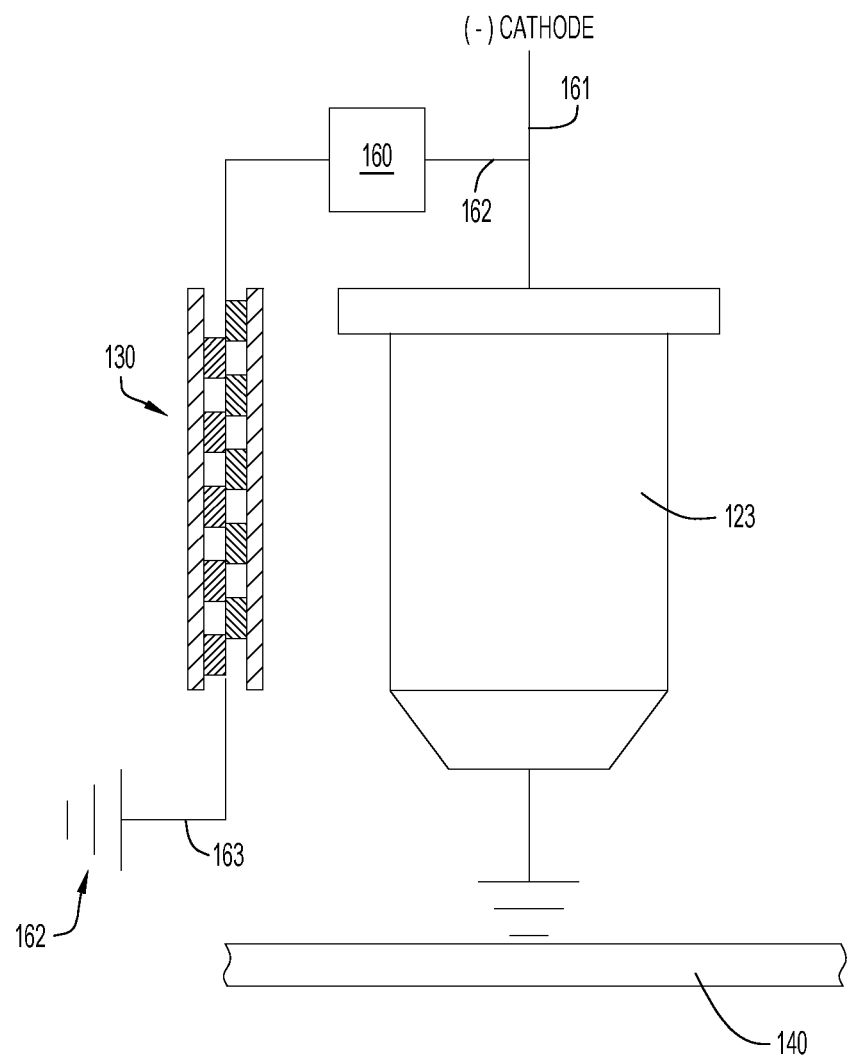
FIG. 6 is a schematic showing how power is delivered to the electrode and to the thermoelectric cooler according to one implementation.

According to some implementations, electrical current is delivered through the array of conductors 133 located in the thermoelectric cooler 130 only upon current being delivered to the electrode 123. FIG. 6 depicts a circuit through which current is delivered to the plasma torch electrode 123 and to the thermoelectric cooler 130 from a common cathode. Current is delivered to the electrode 123 by a first electrical conductor 161 and current is delivered to the thermoelectric cooler 130 via a second electrical conductor 162 that branches from the first electrical conductor 161. According to one implementation, as shown in FIG. 6, the electrode 123 is grounded to the workpiece 140 to which the grounding clamp 16 of the power supply 11 is attached. The thermoelectric cooler 130 may also be connected to a ground terminal 162 located in the power supply 11 via a third electrical conductor 163 located in the cable hose 14.

According to some implementations, DC voltage is applied across each of the electrode 123 and thermoelectric cooler 130. However, because the voltage rating of the electrode 123 is typically much higher than that of the thermoelectric cooler 130, a voltage reduction circuit 160 may be employed upstream the thermoelectric cooler, as shown in FIG. 6, to drop the voltage to meet the DC voltage rating of the thermoelectric cooler.

Figure 10:
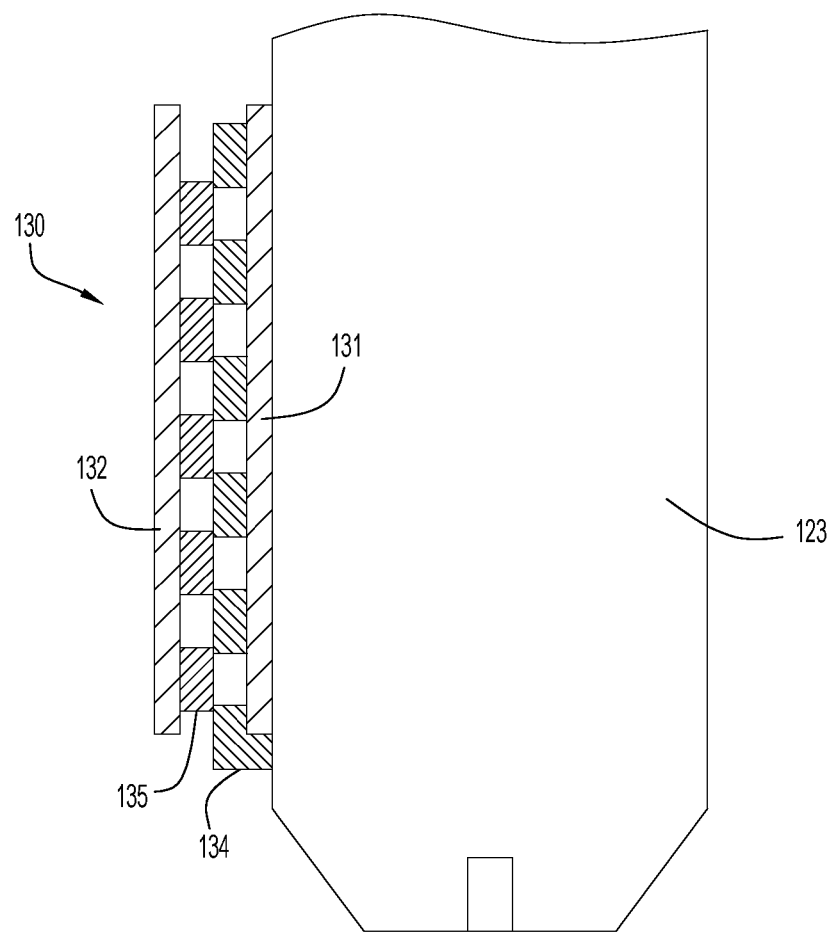
FIG. 10 is a partial cut-away side view of an electrode with a cold plate of a thermoelectric cooler being attached to an exterior surface of the electrode with a conductor of the thermoelectric cooler being coupled directly to the electrode.
Figure 11:
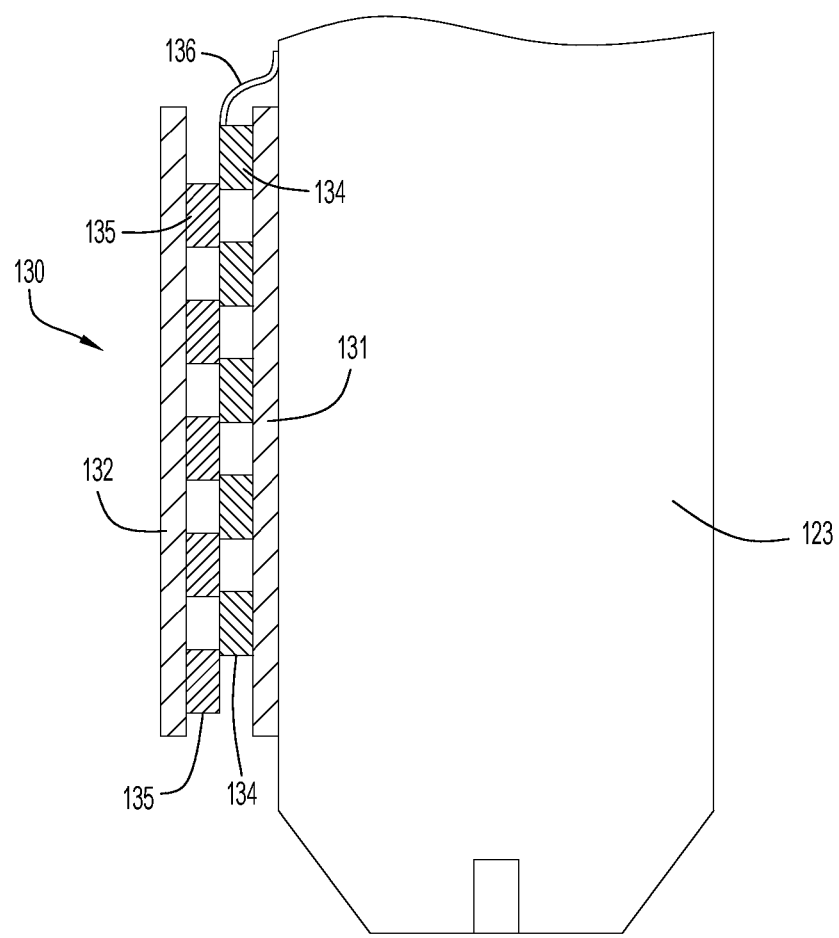
FIG. 11 is a partial cut-away side view of an electrode with a cold plate of a thermoelectric cooler being attached to an exterior surface of the electrode with a conductor of the thermoelectric cooler being coupled to the electrode via an electrical lead.

According to some implementations, power is delivered to the thermoelectric cooler through the electrode 123. According to such implementations, one of the first and second conductors 134 and 135 of the thermoelectric cooler 130 is coupled directly to the electrode 123. FIG. 10 illustrates an implementation in which one of the first conductors 134 of the thermoelectric cooler 130 is directly coupled to the outer surface 123*f* of the electrode 123. Alternatively, one of the first and conductors of the thermoelectric cooler 130 may be electrically coupled to the electrode 123 by electrical lead 136, as shown in FIG. 11. The implementations of FIGS. 10 and 11 may be altered to include a voltage reduction circuit disposed electrically between the electrode and thermoelectric cooler.

Figure 7:
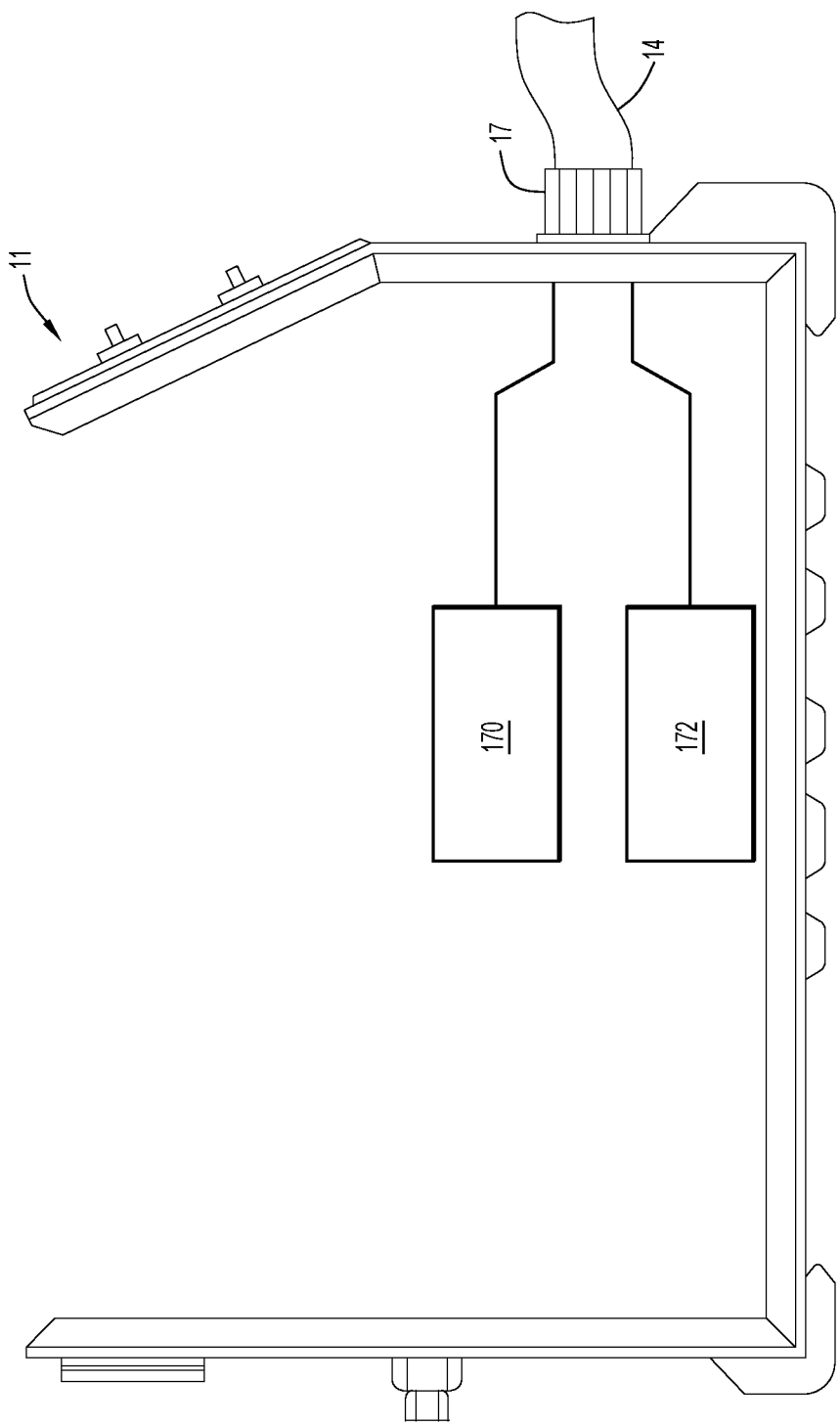
FIG. 7 shows first and second power sources located in the power supply of FIG. 1A, the first and second power sources configured to separately and respectively deliver power to the electrode and to the thermoelectric cooler.

According to some implementations, power is supplied to the electrode 123 and thermoelectric cooler 130 by separate power sources. For example, as shown in FIG. 7 the power supply 11 may include a first power source 170 configured to deliver AC or DC power of a first voltage to the electrode 123 through a first conductor extending through the cable hose 14, and a second power source 172 configured to deliver DC power at a second voltage less than the first voltage to the thermoelectric cooler 130 through a second conductor also extending through the cable hose 14.

Figure 8:
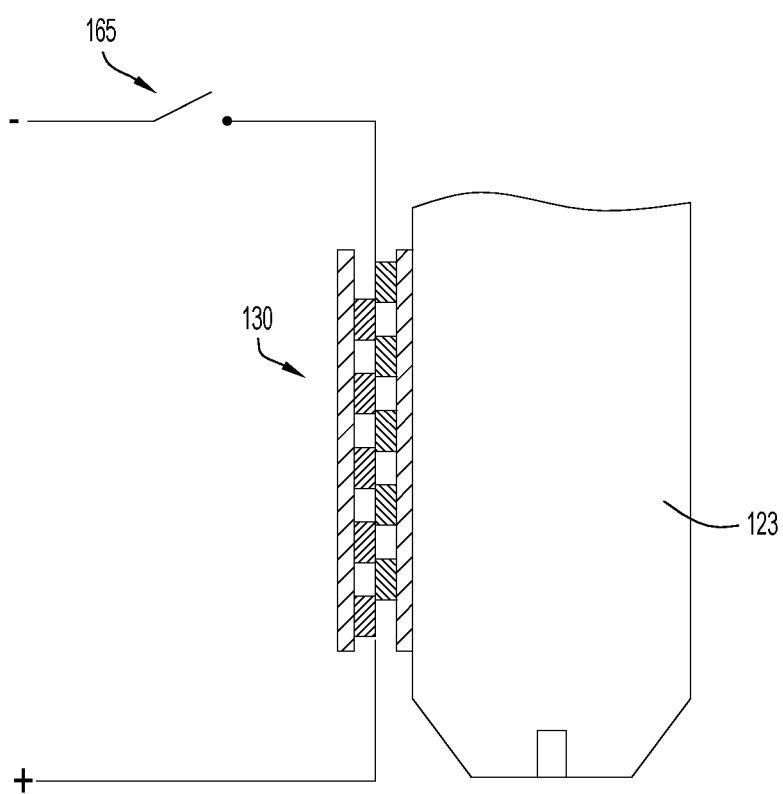
FIG. 8 is a schematic showing a switch located in the power supply circuit of a thermoelectric cooler attached to a side of an electrode of a plasma torch.
Figure 9:
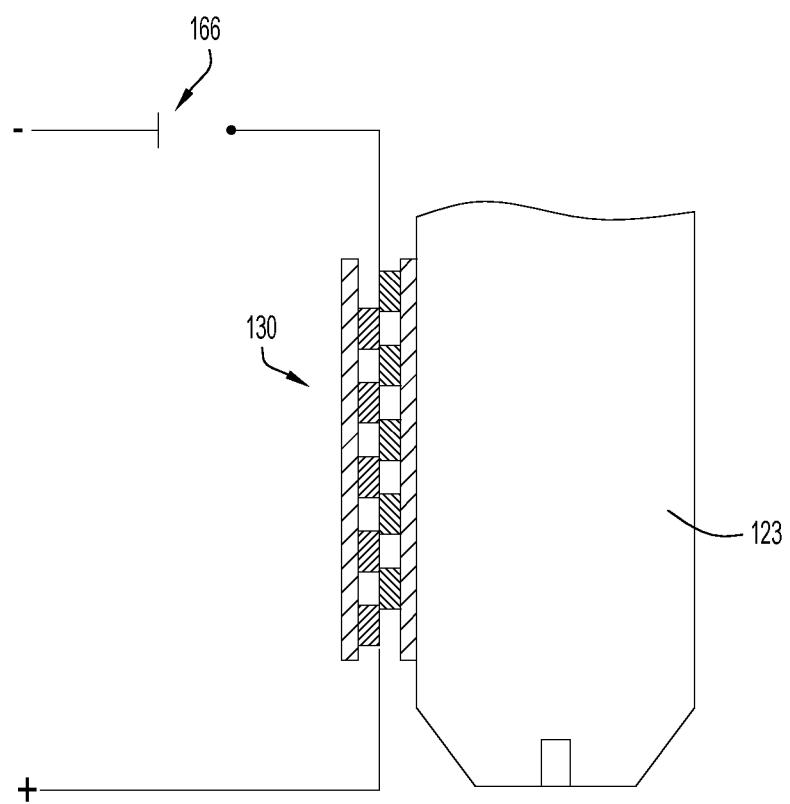
FIG. 9 is a schematic showing a relay located in the power supply circuit of a thermoelectric cooler attached to a side of an electrode of a plasma torch.

According to some implementations, the circuit through which power is delivered to the thermoelectric cooler includes a switch 165 (see FIG. 8) or a relay 166 (see FIG. 9) that transitions from an open position to a closed position to permit the delivery of electrical power to the thermoelectric cooler 130 when electrical power is being delivered to the electrode. According to some implementations, the switch 165 or relay 166 may be directly or indirectly controlled to transition from a normally open position to a closed position by a depressing of the plasma torch trigger 42 by a user.

Figure 12:
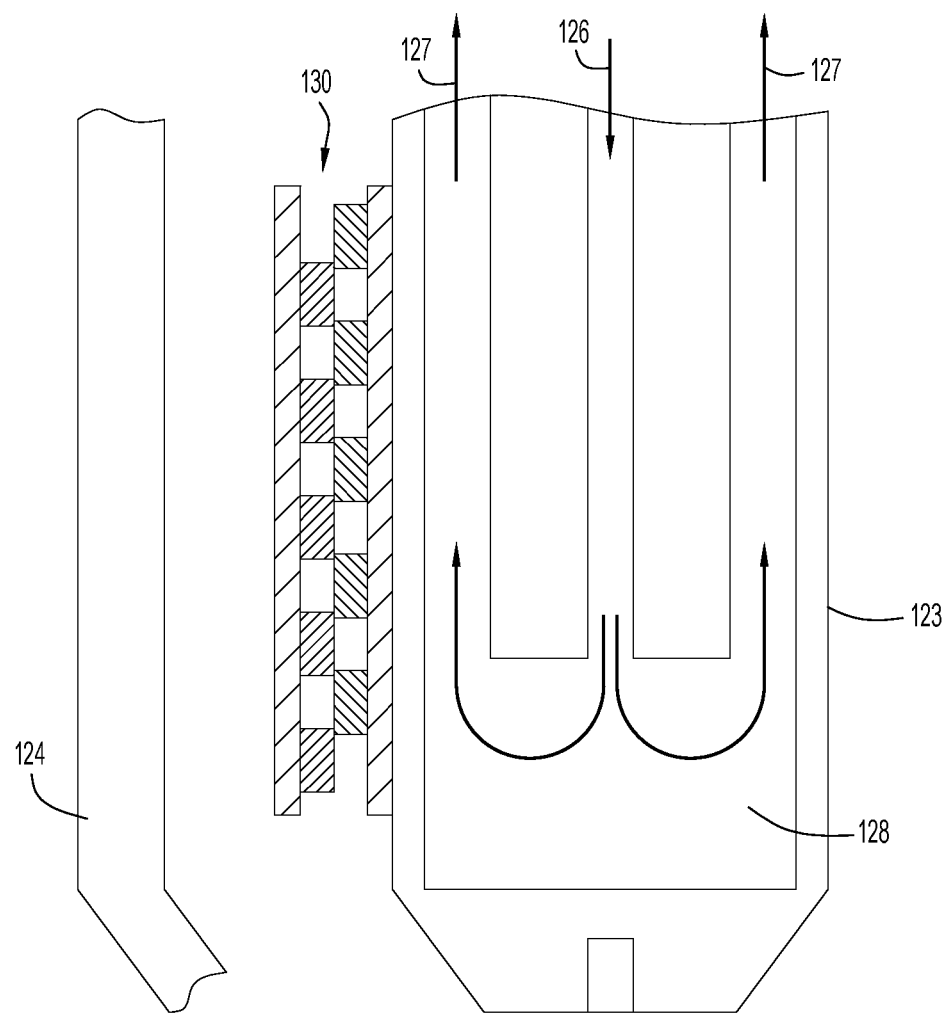
FIG. 12 is a partial cut-away view of an electrode with internal liquid cooling and tip of a plasma torch with a cold plate of a thermoelectric cooler being attached to an exterior surface of the electrode.

FIG. 12 is a partial cut-away view of an electrode 123 (with internal liquid cooling) and tip 124 of a plasma torch with the cold plate 131 of the thermoelectric cooler 130 being attached to an exterior surface of the electrode. The electrode 123 includes an internal cavity 128 through which a liquid coolant circulates (as depicted by the arrows in FIG. 12). The electrode 123 includes one or more liquid coolant inlet channels 126 and one or more liquid coolant outlet channels 127 through which the liquid coolant in introduced and expelled from the internal cavity 128. According to some implementations, the inlet and outlet liquid coolant channels 126 and 127 are in fluid communication with a liquid coolant circulatory system that includes a cooler located inside the power supply 11.

Figure 13:
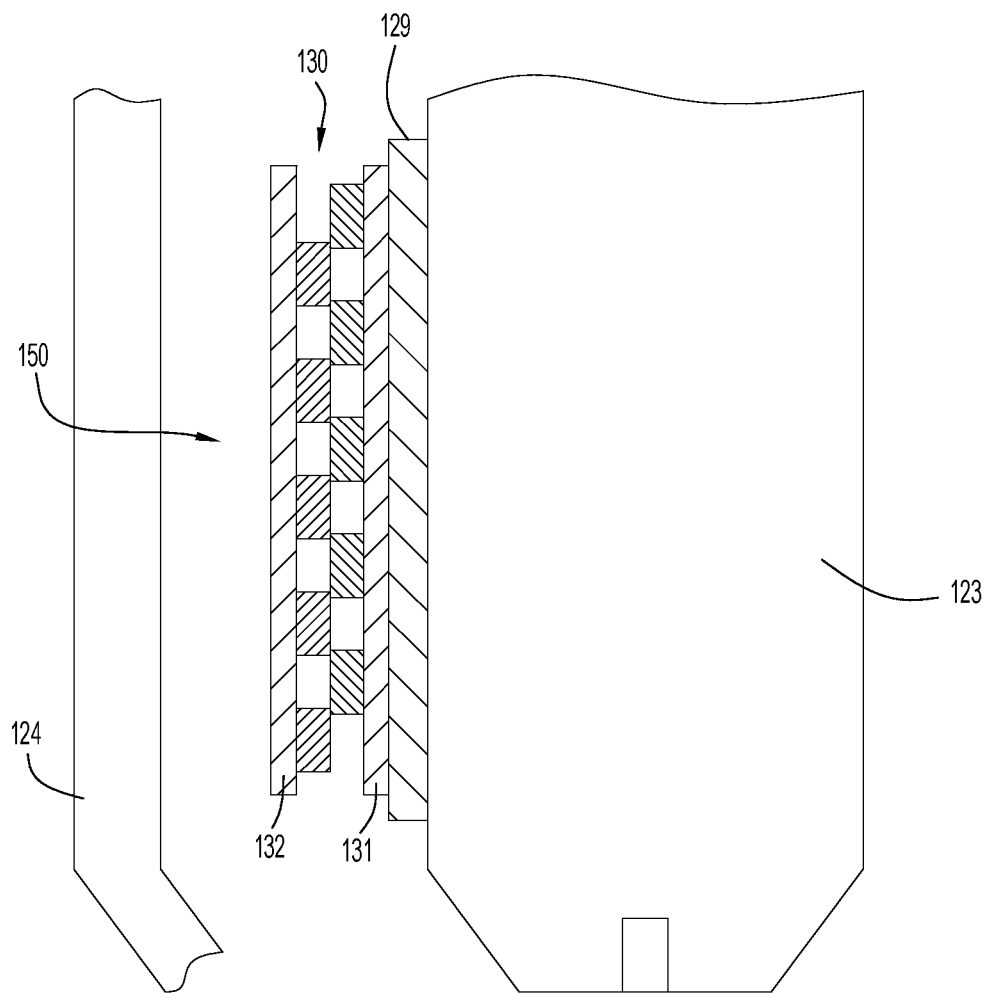
FIG. 13 is a partial cut-away side view of an electrode and tip of a plasma torch with a thermoelectric cooler being disposed between the two, and a heat insulating element being disposed between the electrode and the cold plate of the thermoelectric cooler.

FIG. 13 is a partial cut-away view of an end portion of a plasma torch like that depicted in FIG. 2 with the addition of a thermal insulator 129 being disposed between the cold plate 131 of the thermoelectric cooler 130 and the exterior surface of the electrode 123. Because the cooling efficiency of the thermoelectric cooler 130 greatly diminishes when the temperature difference between the cold plate 131 and the hot plate 132 exceeds a threshold amount, the use of the thermal insulator 129 acts to partially thermally insulate the cold plate 131 from the electrode 123. In doing so, the cold plate 131 can operate below the operating temperature of the electrode 123.

Figure 14:
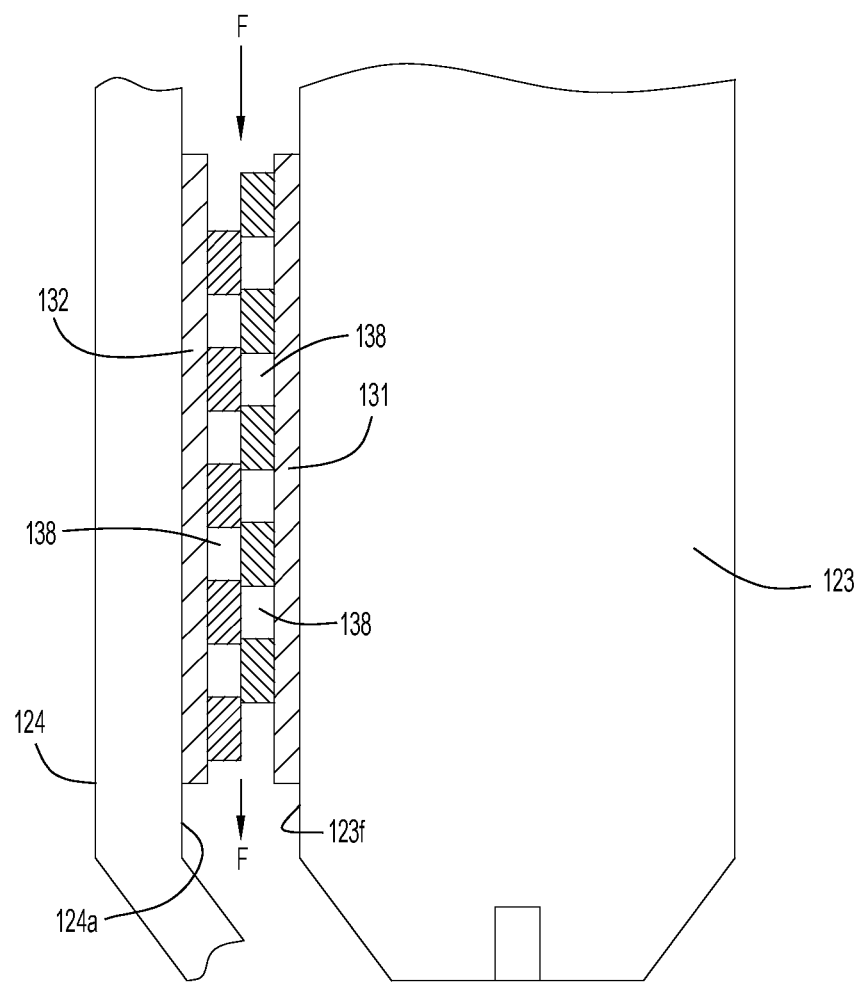
FIG. 14 is a partial cut-away side view of an electrode and tip of a plasma torch with a thermoelectric cooler being disposed between the two, the cold plate of the thermoelectric cooler being attached to an exterior surface of the electrode and the hot plate of the thermoelectric cooler being attached to an interior surface of the tip.

FIG. 14 is a partial cut-away side view of an electrode 123 and tip 124 of a plasma torch 121 with an exterior surface of the cold plate 131 of a thermoelectric cooler 130 being attached to an exterior surface 123*f* of the electrode and an exterior surface of the hot plate being attached to the interior surface 124*a* of the torch tip 124. As shown in FIGS. 4 and 5, according to some implementations the first and second conductors 134 and 135 of the thermoelectric cooler 130 are arranged to produce an array of interconnected voids 138 that collectively extend between the proximal and distal ends of the thermoelectric cooler, the proximal end being located upstream the distal end in relation to the direction of the process gas flow. In the torch configuration of FIG. 14, the array of interconnected voids 138 constitute a part of the process gas flow channel 150 with a portion or all of the process gas flow (see arrows F) delivered to the distal end of the electrode passing internally through the thermoelectric cooler 130. According to some implementations, the array of interconnected voids 138 are arranged to cause the process gas to swirl as it exits the distal end of the thermoelectric cooler.

In conjunction with, or in lieu of using a thermoelectric cooler to remove heat from an electrode of a plasma torch, the process gas may be cooled prior to being delivered across the electrode. The cooling of the process gas may occur anywhere between the gas supply 12 and the electrode 123. For example, the cooling of the process gas may occur inside the power supply 11 and/or inside the cable hose 14 that connects the plasma torch to the power supply and/or inside the plasma torch assembly 20.

Figure 15:
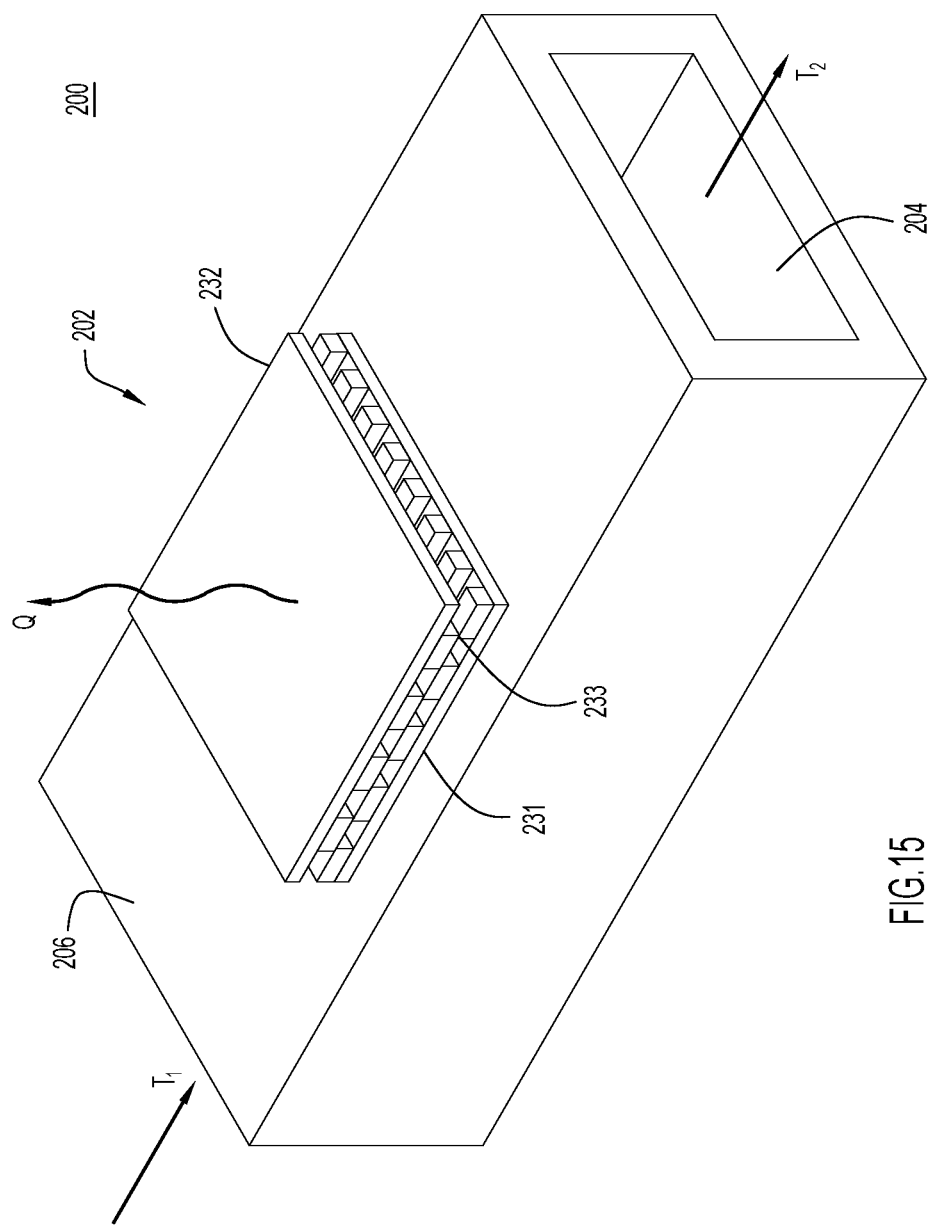
FIG. 15 is an isometric view of a process gas cooling duct.

FIG. 15 shows an apparatus 200 for cooling the process gas according to one implementation. The apparatus 200 includes a duct 202 made of a thermally conductive material having an internal flow passage 204 through which the process gas flows. Process gas enters the internal flow passage at a first temperature T1 and exits the internal flow passage at a second temperature T2 that is less than the first temperature. Cooling of the process gas is achieved by the use of one or more thermoelectric coolers 230 having their cold plates 231 thermally coupled to one or more exterior side surfaces of the duct. In the example of FIG. 15, the cold plate 231 of a single thermoelectric cooler 230 is thermally coupled to a first exterior side surface 206 of the duct 202. According to some implementations, the thermoelectric cooler 230 is constructed similar to the thermoelectric cooler 130 disclosed above, having an array of first and second dissimilar conductors sandwiched between the cold and hot plates 213 and 232. Heat is drawn away from the duct through the cold plate 231 and heat Q is expelled to the environment through the hot plate 232. To enhance the heat removal capacity of the cooling apparatus, forced air may directed across the exterior surface of the hot plate 232. In addition to or instead of using forced air, a heat sink with fins may be thermally coupled to the exterior surface of the hot plate 232 to increase the cooling capacity.

The previous examples are not suggested to limit other variations. The present disclosure is merely exemplary in nature and, thus, variations that do not depart from the spirit of the disclosure are intended to be within the scope of the present disclosure.

What is claimed is:

1. A plasma torch assembly comprising a plasma torch that includes:

an electrode having an exterior surface;

a tip having an interior surface spaced apart from and facing the exterior surface of the electrode;

a process gas flow channel located between the exterior surface of the electrode and the interior surface of the tip; and a thermoelectric cooler including a cold plate, a hot plate and dissimilar first and second electrical conductors, the first and second electrical conductors forming an array of alternating first conductors and second conductors that are arranged electrically in series and thermally in parallel, the first electrical conductors being attached to an interior surface of the cold plate and the second electrical conductors being attached to an interior surface of the hot plate such that, when a current passes through pairs of the first and second electrical conductors, heat is pumped across pairs of the first and second conductors resulting in a cooling of the cold plate and a heating of the hot plate, the cold plate being electrically non-conductive and having an exterior surface thermally coupled to the exterior surface of the electrode, the hot plate being electrically non-conductive and having an exterior surface facing the interior surface of the tip that at least partially defines the process gas flow channel such that when a process gas flows through the process gas flow channel the process gas extracts heat from the hot plate, and one of the first and second electrical conductors being electrically coupled directly to the electrode.

2. The plasma torch assembly according to claim 1, wherein the cold plate and the hot plate each comprise a ceramic.

3. The plasma torch assembly according to claim 1, wherein a voltage reduction circuit exists between the electrode and the one of the first and second electrical conductors.

4. The plasma torch assembly according to claim 1, wherein the thermoelectric cooler is configured to receive electrical power only upon electrical power being delivered to the electrode.

5. The plasma torch assembly according to claim 1, wherein the plasma torch includes a trigger switch that is operable by a user of the plasma torch, the trigger switch being located in an electrical circuit located between a power supply and the electrode, the trigger switch having an open position and a closed position, the trigger switch interrupting electrical power delivery to the electrode in the open position, the trigger switch enabling electrical power delivery to the electrode in the closed position, and the thermoelectric cooler is configured to receive electrical power only when the trigger switch is in the closed position.

6. The plasma torch assembly according to claim 1, wherein a relay is configured to deliver electrical power to the thermoelectric cooler, the relay being transitional between an open position and a closed position, the relay being configured to assume the open position when electrical power is not delivered to the electrode, and the relay being configured to assume the closed position when electrical power is being delivered to the electrode.

7. The plasma torch assembly according to claim 5, wherein a relay is configured to deliver electrical power to the thermoelectric cooler, the relay being transitional between an open position and a closed position, the relay being configured to assume the open position in the open position of the trigger switch, and the relay being configured to assume the closed position in the closed position of the trigger switch.

8. The plasma torch assembly according to claim 1, wherein the plasma torch is coupled to a power supply by a cable hose, the power supply being configured to supply electrical power separately to the electrode and to the one of the first and second electrical conductors of the thermoelectric cooler, the electrode being configured to receive a first current from the power supply, and a the one of the first and second electrical conductors being configured to receive a second current from the power supply, the first current being greater than the second current.

9. The plasma torch assembly according to claim 8, wherein the process gas flow channel of the plasma torch is configured to receive the process gas via the cable hose.

10. The plasma torch assembly according to claim 1, wherein a gap exists between the interior surface of the tip and the exterior surface of the hot plate of the thermoelectric cooler, the gap being a part of the process gas flow channel.

11. The plasma torch assembly according to claim 1, wherein the thermoelectric cooler has a proximal end and a distal end, the array of alternating first and second conductors being arranged to produce an array of interconnected voids that collectively extend between the proximal and distal ends of the thermoelectric cooler, the array of interconnected voids defining at least in part the process gas flow channel.

12. The plasma torch assembly according to claim 11, wherein the exterior surface of the hot plate is coupled directly to the interior surface of the tip.

13. The plasma torch assembly according to claim 11, wherein the array of interconnected voids is configured to cause the process gas to swirl inside a portion of the process gas flow channel located distal to the distal end of the thermoelectric cooler.

14. The plasma torch assembly according to claim 12, wherein the array of interconnected voids is configured to cause the process gas to swirl inside a portion of the process gas flow channel located distal to the distal end of the thermoelectric cooler.

15. The plasma torch assembly according to claim 1, wherein at least a portion of the exterior surface of the cold plate is a curved surface that at least partially circumscribes the exterior surface of the electrode.

16. The plasma torch assembly according to claim 1, wherein the cold plate forms a tube around the electrode.

17. The plasma torch assembly according to claim 1, further comprising a thermal insulating element located between the exterior surface of the electrode and the exterior surface of the cold plate.

18. The plasma torch assembly according to claim 1, wherein the electrode has an internal cavity having a liquid cooling inlet and a liquid cooling outlet.

19. A plasma torch assembly comprising a plasma torch that includes:
an electrode having an exterior surface;
a tip having an interior surface spaced apart from and facing the exterior surface of the electrode;
a process gas flow channel located between the exterior surface of the electrode and the interior surface of the tip;
a thermoelectric cooler including a cold plate, a hot plate and dissimilar first and second electrical conductors, the first and second electrical conductors forming an array of alternating first conductors and second conductors that are arranged electrically in series and thermally in parallel, the first electrical conductors being attached to an interior surface of the cold plate and the second electrical conductors being attached to an interior surface of the hot plate such that, when a current passes through pairs of the first and second electrical conductors, heat is pumped across pairs of the first and second conductors resulting in a cooling of the cold plate and a heating of the hot plate, the cold plate being electrically non-conductive and having an exterior surface thermally coupled to the exterior surface of the electrode, the hot plate being electrically non-conductive and having an exterior surface facing the interior surface of the tip that at least partially defines the process gas flow channel such that when a process gas flows through the process gas flow channel the process gas extracts heat from the hot plate; and
a thermal insulating element located between the exterior surface of the electrode and the exterior surface of the cold plate.

20. A plasma torch assembly comprising a plasma torch that includes:
an electrode having an exterior surface;
a tip having an interior surface spaced apart from and facing the exterior surface of the electrode;
a process gas flow channel located between the exterior surface of the electrode and the interior surface of the tip; and
a thermoelectric cooler including a cold plate, a hot plate and dissimilar first and second electrical conductors, the first and second electrical conductors forming an array of alternating first conductors and second conductors that are arranged electrically in series and thermally in parallel, the first electrical conductors being attached to an interior surface of the cold plate and the second electrical conductors being attached to an interior surface of the hot plate such that, when a current passes through pairs of the first and second electrical conductors, heat is pumped across pairs of the first and second conductors resulting in a cooling of the cold plate and a heating of the hot plate, the cold plate being electrically non-conductive and having an exterior surface thermally coupled to the exterior surface of the electrode, the hot plate being electrically non-conductive and having an exterior surface facing the interior surface of the tip that at least partially defines the process gas flow channel such that when a process gas flows through the process gas flow channel the process gas extracts heat from the hot plate, one of the first and second electrical conductors is electrically coupled to the electrode, and a voltage reduction circuit existing between the electrode and the one of the first and second electrical conductors.

* * * * *

UNITED STATES PATENT AND TRADEMARK OFFICE
CERTIFICATE OF CORRECTION

| | | |
|---|---|---|
| PATENT NO. | : 11,700,682 B2 | Page 1 of 1 |
| APPLICATION NO. | : 16/512656 | |
| DATED | : July 11, 2023 | |
| INVENTOR(S) | : Andrew Raymond | |

It is certified that error appears in the above-identified patent and that said Letters Patent is hereby corrected as shown below:

In the Claims

Claim 8, Column 11, Line 19, replace "current from the power supply, and a the one of the first and" with --current from the power supply, and the one of the first and--

Signed and Sealed this
Seventeenth Day of October, 2023

Katherine Kelly Vidal
*Director of the United States Patent and Trademark Office*